(12) United States Patent
Choi

(10) Patent No.: US 8,421,090 B2
(45) Date of Patent: Apr. 16, 2013

(54) ORGANIC LIGHT EMITTING DIODE DISPLAY AND METHOD OF MANUFACTURING THE SAME

(75) Inventor: Jong-Hyun Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 325 days.

(21) Appl. No.: 12/805,701

(22) Filed: Aug. 16, 2010

(65) Prior Publication Data

US 2011/0049507 A1    Mar. 3, 2011

(30) Foreign Application Priority Data

Sep. 3, 2009 (KR) .................. 10-2009-0083128

(51) Int. Cl.
*H01L 21/00* (2006.01)
(52) U.S. Cl.
USPC ............. 257/79; 438/197; 257/E21.134
(58) Field of Classification Search ............ 257/79, 257/E21.134; 438/197
See application file for complete search history.

(56) References Cited

U.S. PATENT DOCUMENTS

| 7,358,528 B2 | 4/2008 | Kim et al. |
| 2005/0012152 A1 | 1/2005 | Park et al. |
| 2005/0176194 A1 * | 8/2005 | Sasaki et al. ............ 438/197 |
| 2008/0073654 A1 * | 3/2008 | Miyake et al. ............ 257/79 |
| 2008/0116457 A1 | 5/2008 | Park et al. |

FOREIGN PATENT DOCUMENTS

| CN | 101421767 A | 4/2009 |
| JP | 2004-356658 A | 12/2004 |
| JP | 2008-085053 A | 4/2008 |
| JP | 2009-033145 A | 2/2009 |
| KR | 10-2005-0003249 A | 1/2005 |
| KR | 10-2005-0003258 A | 1/2005 |
| KR | 10-2005-0011602 A | 1/2005 |
| KR | 10-2006-0075586 A | 7/2006 |
| KR | 10-2006-0075587 A | 7/2006 |
| KR | 10 2009-0080932 A | 7/2009 |

* cited by examiner

*Primary Examiner* — Steven J Fulk
(74) *Attorney, Agent, or Firm* — Lee & Morse, P.C.

(57) ABSTRACT

A display and a method of manufacturing the same, the display including a substrate main body, a first thin film transistor on the substrate main body, the first thin film transistor including a first gate electrode, the first gate electrode including polycrystalline silicon, a first semiconductor layer on the first gate electrode, first source electrode, and a first drain electrode, and a second thin film transistor on the substrate main body, the second thin film transistor including a second semiconductor layer, the second semiconductor layer including polycrystalline silicon and being on a same plane as the first gate electrode, a second gate electrode on the second semiconductor layer, a second source electrode, and a second drain electrode.

20 Claims, 6 Drawing Sheets

ORGANIC LIGHT EMITTING DIODE DISPLAY AND METHOD OF MANUFACTURING THE SAME

BACKGROUND

1. Field

Embodiments relate to an organic light emitting diode (OLED) display and a method of manufacturing the same.

2. Description of the Related Art

An organic light emitting diode (OLED) display is a self emissive display device that displays images using organic light emitting diodes. The organic light emitting diode display differs from a liquid crystal display (LCD) in that it does not require a separate light source, and has a relatively small thickness and weight. Furthermore, the organic light emitting diode display may provide attractive characteristics such as low power consumption, high luminance, and short response time, and has been targeted as a display device for portable electronic appliances.

SUMMARY

Embodiments are directed to an organic light emitting diode (OLED) display and a method of manufacturing the same, which substantially overcome one or more problems due to limitations and disadvantages of the related art.

It is therefore a feature of an embodiment to provide an organic light emitting diode display using an oxide semiconductor layer and a polycrystalline silicon semiconductor layer together.

It is therefore another feature of an embodiment to provide a display in which a drive transistor may be formed using an oxide thin film transistor and in which a driving circuit for a non-display area, or a switching or compensating circuit of a pixel, may be formed using a polycrystalline silicon thin film transistor.

At least one of the above and other features and advantages may be realized by providing a display including a substrate main body, a first thin film transistor on the substrate main body, the first thin film transistor including a first gate electrode, the first gate electrode including polycrystalline silicon, a first semiconductor layer on the first gate electrode, a first source electrode, and a first drain electrode, and a second thin film transistor on the substrate main body, the second thin film transistor including a second semiconductor layer, the second semiconductor layer including polycrystalline silicon and being on a same plane as the first gate electrode, a second gate electrode on the second semiconductor layer, a second source electrode, and a second drain electrode.

The first semiconductor layer may be on the first gate electrode, and an insulating layer may be disposed between the first semiconductor layer and the first gate electrode, and the second gate electrode may be on the second semiconductor layer, and the insulating layer may extend between the second gate electrode and the second semiconductor layer.

The first and second thin film transistors may each be included in a same pixel.

At least one of the above and other features and advantages may also be realized by providing a display including a substrate main body, a first gate electrode on the substrate main body, the first gate electrode including polycrystalline silicon, a second semiconductor layer on the substrate main body, the second semiconductor layer including polycrystalline silicon and being on a same plane as the first gate electrode, a gate insulating layer, the gate insulating layer being on each of the first gate electrode and the second semiconductor layer, a first semiconductor layer on the first gate electrode, the gate insulating layer being between the first semiconductor layer and the first gate electrode, a second gate electrode on the second semiconductor layer, the gate insulating layer being between the second gate electrode and the second semiconductor layer, and respective source and drain electrodes contacting the first and second semiconductor layers.

The first gate electrode and the second semiconductor layer may each be included in a same pixel.

The display may further include an interlayer insulating layer, the interlayer insulating layer being on each of the first semiconductor layer and the second gate electrode. A first source electrode and a first drain electrode may contact the first semiconductor layer and penetrate through the interlayer insulating layer, and a second source electrode and a second drain electrode may contact the second semiconductor layer and penetrate through each of the interlayer insulating layer and the gate insulating layer.

The first semiconductor layer may include an oxide semiconductor.

The oxide semiconductor may contain oxygen (O) and one or more of gallium (Ga), indium (In), zinc (Zn), and tin (Sn).

The second semiconductor layer may include a channel region, a source region, and a drain region, the second gate electrode may at least partially overlap the channel region, and the source and drain regions may be disposed at respective sides of the channel region.

The channel region of the second semiconductor layer may include non-doped polycrystalline silicon, and the source and drain regions of the second semiconductor layer may each include impurity-doped polycrystalline silicon.

The impurities may be P-type impurities.

The first gate electrode may include the same impurity-doped polycrystalline silicon as the source and drain regions of the second semiconductor layer, and the first gate electrode may be disposed at a same plane as the source and drain regions of the second semiconductor layer.

At least one of the above and other features and advantages may also be realized by providing a method of manufacturing an organic light emitting diode display, the method including forming a first gate electrode on a substrate main body, the first gate electrode including polycrystalline silicon, forming a second semiconductor layer on the substrate main body, the second semiconductor layer including polycrystalline silicon and being formed on a same plane as the first gate electrode, forming a gate insulating layer, the gate insulating layer being formed on each of the first gate electrode and the second semiconductor layer, forming a first semiconductor layer on the first gate electrode, the gate insulating layer being between the first semiconductor layer and the first gate electrode, forming a second gate electrode on the second semiconductor layer, the gate insulating layer being between the second gate electrode and the second semiconductor layer, and forming respective source and drain electrodes contacting the first and second semiconductor layers.

The method may further include patterning a polycrystalline silicon layer to form a first gate electrode precursor and a second semiconductor layer precursor from the polycrystalline silicon layer, and doping impurities into the first gate electrode precursor and the second semiconductor layer precursor to form the first gate electrode and the second semiconductor layer, respectively. The first semiconductor layer may be formed on the gate insulating layer such that the first semiconductor layer is at least partially overlapped with the first gate electrode, and the second gate electrode may be formed on the gate insulating layer such that the second gate electrode is at least partially overlapped with the second semiconductor layer.

The first semiconductor layer may be formed with an oxide semiconductor.

The oxide semiconductor may contain oxygen (O) and one or more of gallium (Ga), indium (In), zinc (Zn), and tin (Sn).

The second semiconductor layer may include a channel region, a source region, and a drain region, the second gate electrode may block the doping of the impurities in the channel region, and the source and drain regions may be formed at respective sides of the channel region, the source and drain regions each being doped with the impurities.

The impurities may be P-type impurities.

The first gate electrode may be formed of a same doped material, and at a same plane, as the source and drain regions of the second semiconductor layer.

The second semiconductor layer may include a channel region, a source region, and a drain region, and the first gate electrode may be formed of a same doped material, and at a same plane, as the source and drain regions of the second semiconductor layer.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
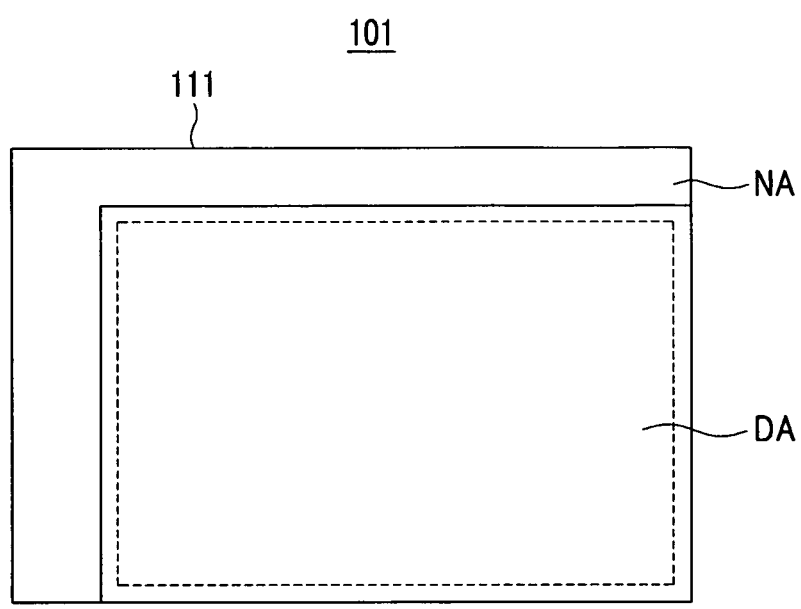
FIG. 1 illustrates a schematic plan view of an organic light emitting diode display according to an example embodiment.

Korean Patent Application No. 10-2009-0083128, filed on Sep. 3, 2009, in the Korean Intellectual Property Office, and entitled: "Organic Light Emitting Diode Display and Method for Manufacturing the Same" is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" (or "under") another layer or substrate, it can be directly on (or under) the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

As described herein, an organic light emitting diode display and a method of manufacturing the same may provide advantages of enhancing performance characteristics of the display while simplifying the manufacturing process thereof. The organic light emitting diode display may use both an oxide semiconductor layer and a polycrystalline silicon semiconductor layer together, such that the overall performance characteristics of the display may be enhanced while using a simple structure. Furthermore, a method of manufacturing the organic light emitting diode display may be simplified.

An organic light emitting diode display according to a first example embodiment will now be described with reference to FIGS. 1 to 3.

As shown in FIG. 1, an organic light emitting diode display 101 may include a substrate main body 111 that has a display area DA and a non-display area NA. A plurality of pixels PE (see FIG. 2) may be formed in the display area DA of the substrate main body 111 so as to display images. Various driving circuits may be formed at the non-display area NA. The organic light emitting diode display 101 may have a plurality of pixels PE.

Figure 2:
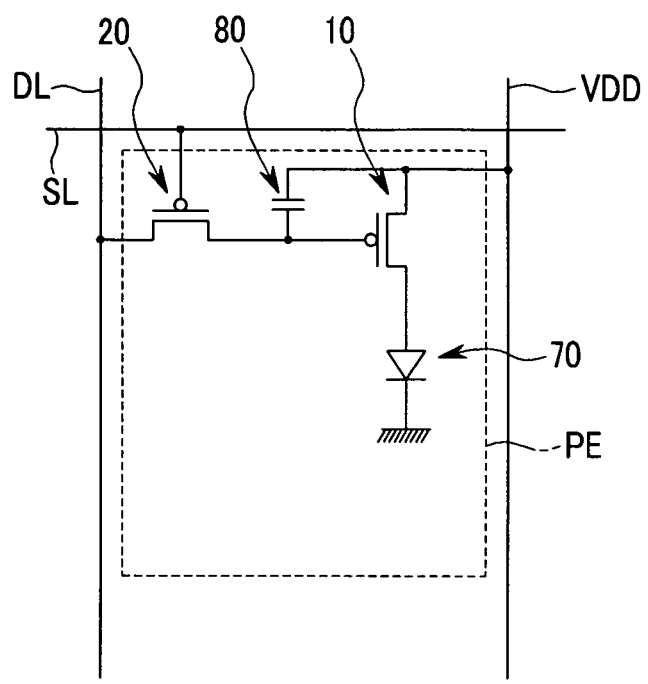
FIG. 2 illustrates a circuit diagram of a pixel circuit in the organic light emitting diode display shown in FIG. 1.

As shown in FIG. 2, a pixel PE may include a two transistor-one capacitor (2Tr-1Cap) structure. The pixel PE may include an organic light emitting diode 70, two thin film transistors (TFTs) 10 and 20, and a capacitor 80.

In other implementations, the pixel PE may be provided with three or more thin film transistors and two or more capacitors, and wires may be formed thereto. The thin film transistors and the capacitors additionally provided may form a compensating circuit, the compensating circuit improving uniformity of the organic light emitting diode 70 formed at each pixel PE so as to prevent image quality from being uneven. The compensating circuit may include, e.g., four to eight thin film transistors.

The driving circuit(s) formed at the non-display area NA of the substrate main body 111 may include additional thin film transistors.

The organic light emitting diode 70 may have an anode (hole injection electrode), a cathode (electron injection electrode), and an organic emissive layer disposed between the anode and the cathode.

The two thin film transistors according to an exemplary embodiment include the first thin film transistor 10 and the second thin film transistor 20. The first and second thin film transistors 10 and 20 each include a gate electrode, a semiconductor layer, a source electrode, and a drain electrode. In an example embodiment, the semiconductor layer of the first thin film transistor 10 is an oxide semiconductor layer, and the semiconductor layer of the second thin film transistor 20 is a polycrystalline silicon semiconductor layer. That is, the first thin film transistor 10 is an oxide thin film transistor, and the second thin film transistor 20 is a polycrystalline silicon thin film transistor.

In the example circuit shown in FIG. 2, the first thin film transistor 10 is connected to the organic light emitting diode 70. The second thin film transistor is connected to a scan line SL and a data line DL. The second thin film transistor 20 is used as a switch for selecting a pixel PE to be excited. The gate electrode of the second thin film transistor 20 is connected to the scan line SL, and the source electrode of the second thin film transistor 20 is connected to the data line DL. The second thin film transistor 20 transmits the data voltage input from the data line DL to the first thin film transistor 10 in accordance with the switching voltage input into the scan line SL. The capacitor 80 is connected to the second thin film transistor 20 and a common power line VDD, and stores a voltage corresponding to a difference between the voltage transmitted from the second thin film transistor 20 and the voltage supplied to the common power line VDD. The first thin film transistor 10 supplies driving power to the organic light emitting diode 70 within the selected pixel PE to drive it and emit light. The gate electrode of the first thin film transistor 10 is connected to a capacitor plate of the capacitor 80 connected with the drain electrode of the second thin film transistor 20. The source electrode of the first thin film transistor 10 and the other capacitor plate of the capacitor 80 are connected to the common power line VDD, respectively. Furthermore, the drain electrode of the first thin film transistor 10 is connected to the anode of the organic light emitting diode 70. In this way, the first thin film transistor 10 is connected to the common power line VDD and the capacitor 80 so as to supply an output current $I_{OLED}$ to the organic light emitting diode 70. In other implementations, the structure of the pixel PE may be altered in various manners.

In operation, the output current $I_{OLED}$ may be provided to the organic light emitting diode 70 in an amount proportional to the square of the difference between a voltage $V_{gs}$ stored at the capacitor 80 and the threshold voltage $V_{th}$ of the first thin film transistor 10. In circuits with voltage compensation, the output current $I_{OLED}$ may be proportional to the square of the difference between a supply voltage (ELVdd) and a data voltage ($V_{data}$). The organic light emitting diode 70 emits light by way of the output current $I_{OLED}$ supplied from the first thin film transistor 10.

Figure 3:
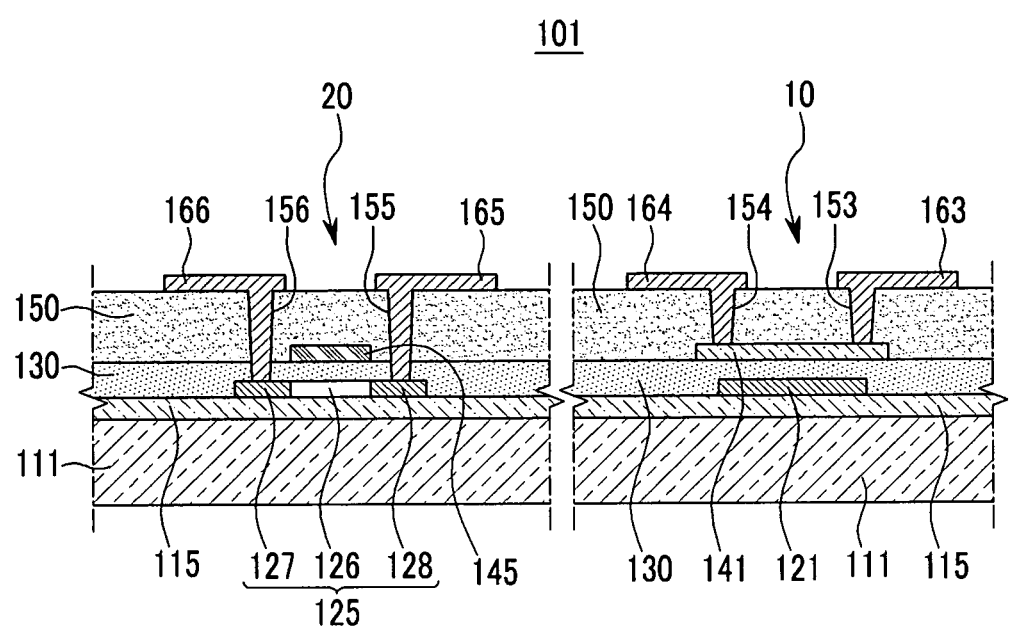
FIG. 3 illustrates an enlarged partial sectional view of thin film transistors in the organic light emitting diode display shown in FIG. 1.

FIG. 3 illustrates an enlarged partial sectional view of thin film transistors in the organic light emitting diode display shown in FIG. 1. As shown in FIG. 3, the first thin film transistor 10 may be an inverted, or bottom up, transistor.

The first thin film transistor 10 may include a first gate electrode 121, a first semiconductor layer 141, a first source electrode 163, and a first drain electrode 164. The first semiconductor layer 141 may be an oxide semiconductor layer.

The second thin film transistor 20 may be a non-inverted transistor, i.e., the second thin film transistor 20 may have a structure in which the order of the gate electrode, gate insulating layer, and semiconductor layer is opposite to that of the first thin film transistor 10.

The second thin film transistor 20 may include a second gate electrode 145, a second semiconductor layer 125, a second source electrode 165, and a second drain electrode 166. The second semiconductor layer 125 may be a polycrystalline silicon semiconductor layer. As described below, the second semiconductor layer 125 of the non-inverted second thin film transistor 20 may be formed at a same level, relative to the base substrate, as the first gate electrode 121 of the inverted first thin film transistor 10. Further, the second semiconductor layer 125 and the first gate electrode 121 may be simultaneously formed by patterning a monolithic material layer.

The structure of the first and second thin film transistors 10 and 20 according to an example embodiment will now be described in detail with reference to FIG. 3, based on the sequence of deposition.

The substrate main body 111 may be formed of an insulating material such as glass, quartz, ceramic, plastic, etc. In another implementation, the substrate main body 111 may be formed of a metallic material, e.g., stainless steel or another metal.

A buffer layer 115 may be formed on the substrate main body 111. The buffer layer 115 may be formed of inorganic and/or organic materials. The buffer layer 115 may help flatten the surface of the substrate main body 111 while preventing the intrusion of undesirable components, e.g., impurities, moisture, etc. The buffer layer 115 may be implemented in accordance with the type of the substrate main body 111 and processing conditions of the substrate main body 111.

The first gate electrode 121 and the second semiconductor layer 125 may be formed on the substrate main body 111, e.g., on the buffer layer 115. As described below in connection with FIG. 4, the first gate electrode 121 and the second semiconductor layer 125 may be formed from a same polycrystalline silicon layer.

The second semiconductor layer 125 may be demarcated into a channel region 126, and source and drain regions 128 and 127 formed at both sides of the channel region 126, respectively. The channel region 126 of the second semiconductor layer 125 may be formed of a non-doped polycrystalline silicon layer, an intrinsic semiconductor. The source and drain regions 128 and 127 of the second semiconductor layer 125 may be formed with an impurity-doped polycrystalline silicon layer. For example, the semiconductor layer, except the channel region, may be doped with impurities. The impurities doped at the source and drain regions 128 and 127 of the second semiconductor layer 125 may be P-type impurities, e.g., boron (B) ions or like materials used as P-type impurities. In another implementation, the doped impurities may be N-type impurities, e.g., phosphorous (P) ions or like materials used as N-type impurities.

In an example embodiment, the first gate electrode 121 is formed in the same way as the source and drain regions 128 and 127 of the second semiconductor layer 125, using an impurity-doped polycrystalline silicon layer, the first gate electrode 121 being formed together with, and at the same time as, the source and drain regions 128 and 127 of the second semiconductor layer 125, such that the first gate electrode 121 is placed on the same plane thereof. As such, efficiency of the manufacturing process may be improved.

The efficiency of the manufacturing process may be further improved by using a same material layer to simultaneously form gate insulating structures for each of the first and second thin film transistors 10 and 20. For example, a monolithic gate insulating layer 130 may be formed on each of the first gate electrode 121 and the second semiconductor layer 125. The gate insulating layer 130 may be formed of, e.g., silicon nitride (SiNx) or silicon oxide (SiOx).

The second gate electrode 145 and the first semiconductor layer 141 may be formed on the gate insulating layer 130. The second gate electrode 145 may be at least partially overlapped with the channel region 126 of the second semiconductor layer 125, i.e., the second gate electrode 145 may be directly above the channel region 126. The second gate electrode 145 may have a width less than that of the second semiconductor layer 125. When impurities are doped into the source and drain regions 128 and 127 of the second semiconductor layer 125 during the process of forming the second semiconductor layer 125, the second gate electrode 145 may reduce or prevent the doping of the impurities into the channel region 126.

The second gate electrode 145 may be formed of a metallic layer. For example, the second gate electrode 145 may be formed with a metallic material such as Al, Ag, Cr, Ti, Ta, Mo, alloys thereof, etc. The second gate electrode 145 may be formed to have a single-layered structure, or a multi-layered structure including, e.g., a metallic layer based on a metallic material having excellent physicochemical characteristics, such as Cr, Mo, Ti, Ta, and alloys thereof, and a metallic layer based on Al or Ag having low resistivity. Preferably, the material and structure of the second gate electrode is selected such that, when impurities are doped into the source and drain regions 128 and 127 of the second semiconductor layer 125, the second gate electrode 145 is able to prevent the impurities from being doped into the channel region 126.

The first semiconductor layer 141 may be at least partially overlapped with the first gate electrode 121, i.e., the first semiconductor layer 141 may be directly above the first gate electrode 121. The first semiconductor layer 141 may be formed of an oxide semiconductor. The oxide semiconductor used for the first semiconductor layer 141 may be, or may include, an oxide material containing oxygen (O) and one or more of gallium (Ga), indium (In), zinc (Zn), and tin (Sn). In an implementation, the first semiconductor layer 141 may be formed with a mixed oxide that includes, e.g., InZnO, InGaO, InSnO, ZnSnO, GaSnO, GaZnO, and/or GaInZnO.

Using an oxide semiconductor for the first thin film transistor 10 may provide the first thin film transistor 10 with an effective charge mobility that is two times to one hundred times greater than that of a thin film transistor based on hydrogenated amorphous silicon. Further, the first thin film transistor 10 may have an on/off current ratio of, e.g., 105 to 108. Thus, the first thin film transistor 10 using the oxide semiconductor may exhibit superior semiconductor characteristics. Furthermore, with an oxide semiconductor, little or no optical leakage current from visible light may be generated because the band gap of the oxide semiconductor may be about 3.0 eV to 3.5 eV. Accordingly, momentary afterimages of the first thin film transistor 10 may be reduced or prevented. In an implementation, in order to improve the characteristics of the first thin film transistor 10, the first semiconductor layer 141 may further contain elements of the third, fourth, or fifth group of the periodic table, or transition elements.

As shown in FIG. 3, an interlayer insulating layer 150 may be formed on each of the first semiconductor layer 141 and the second gate electrode 145. The interlayer insulating layer 150 may have a first source contact hole 153 and a first drain contact hole 154, each of which partially exposes the first semiconductor layer 141. Furthermore, the interlayer insulating layer 150 and the gate insulating layer 130 may each have a second source contact hole 155 and a second drain contact hole 156 penetrating therethrough and partially exposing the source and drain regions 128 and 127 of the second semiconductor layer 125, respectively. The interlayer insulating layer 150 may be formed of, e.g., silicon nitride (SiNx), silicon oxide (SiOx), etc.

A first source electrode 163, a first drain electrode 164, a second source electrode 165, and a second drain electrode 166 may be formed on the interlayer insulating layer 150. The first source and drain electrodes 163 and 164 may respectively contact the first semiconductor layer 141 through the first source and drain contact holes 153 and 154, while being spaced apart from each other by a distance. The second source and drain electrodes 165 and 166 may respectively contact the source and drain regions 128 and 127 of the second semiconductor layer 125 through the second source and drain contact holes 155 and 156, while being spaced apart from each other by a distance.

As described above, the organic light emitting diode display 101 according to an example embodiment may use an oxide semiconductor for the first thin film transistor 10 and a polycrystalline silicon semiconductor for the second thin film transistor 20, which may enhance the performance characteristics of the display while having a simplified structure and manufacturing method.

The first thin film transistor 10 may be connected, e.g., directly connected, to the organic light emitting diode 70 to drive it. Further, the driving first thin film transistor 10 may be formed with an oxide semiconductor that exhibits relatively high uniformity, thereby reducing pixel-to-pixel variations. The second thin film transistor 20 may be used for a select transistor, for a driving circuit of the non-display area (NA), for a switching or compensating circuit of the pixel PE, etc., and may be formed with a polycrystalline silicon semiconductor having relatively high electron mobility.

As described above, an organic light emitting diode display may use oxide thin film transistors, i.e., oxide semiconductor-based thin film transistors, for a pixel transistor (or transistors) that require uniform characteristics. The oxide thin film transistor may provide higher electron mobility and reliability than a transistor formed using amorphous silicon. Furthermore, such oxide thin film transistors may be advantageous for constructing a transparent display device. As compared to a polycrystalline silicon-based thin film transistor, the oxide thin film transistor may also provide superior uniformity, although electron mobility may be less. Accordingly, according to an example embodiment employing a simple structure with both oxide-based and polysilicon-based transistors, the organic light emitting diode display 101 may be improved both in uniformity and electron mobility overall.

A method of manufacturing the organic light emitting diode display 101 according to an example embodiment will now be described with reference to FIGS. 4 to 6.

Figure 4:
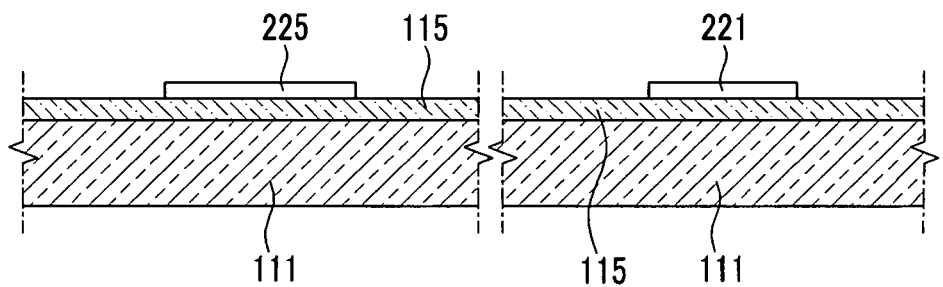
FIG. 4 to FIG. 6 sequentially illustrate cross-sectional views of stages in a method of manufacturing the thin film transistors shown in FIG. 3.

In the example embodiment shown in FIG. 4, the buffer layer 115 may be formed on the substrate main body 111. A polycrystalline silicon layer may be formed on the substrate main body 111, e.g., on the buffer layer 115. The polycrystalline silicon layer may be formed by, e.g., forming an amorphous silicon layer and crystallizing the amorphous silicon layer. Various techniques are well known for crystallizing amorphous silicon layer and details thereof will be omitted. The amorphous silicon layer may be crystallized using, e.g., heat, lasers, joule heating, an electric field, a catalyst metal, etc.

A first gate electrode precursor 221 and a second semiconductor layer precursor 225 may be formed by patterning the polycrystalline silicon layer. For example, the first gate electrode precursor 221 and the second semiconductor layer precursor 225 may be formed simultaneously from a monolithic polycrystalline silicon layer.

Figure 5:
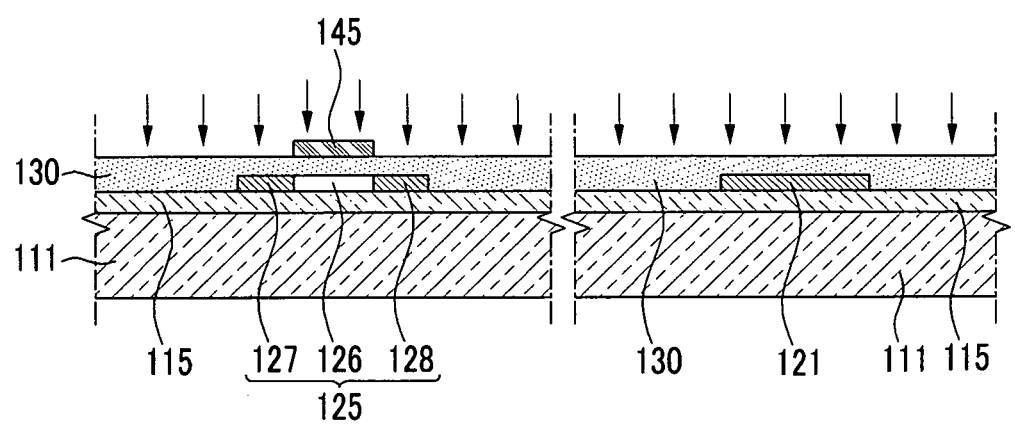

Referring to FIG. 5, the gate insulating layer 130 may be formed on each of the first gate electrode precursor 221 and the second semiconductor layer precursor 225. A single material layer, e.g., a silicon nitride (SiNx) or silicon oxide (SiOx) material layer, may be used to form gate insulating structures for both oxide-based and polysilicon-based thin film transistors. The oxide-based and polysilicon-based thin film transistors may be together in a same pixel PE or in separate parts of the display.

The second gate electrode 145 may be formed on the gate insulating layer 130 such that it is partially overlapped with the second semiconductor layer precursor 225. The second gate electrode 145 may be formed by, e.g., depositing a metallic layer and patterning the metallic layer.

The first gate electrode 121 and the second semiconductor layer 125 may be formed from the respective precursors 221, 225 by, e.g., doping impurities into the first gate electrode precursor 221 and the second semiconductor layer precursor 225. The second semiconductor layer 125 may have a channel region 126 defined therein where the doping of impurities is intercepted by the second gate electrode 145, and may have source and drain regions 128 and 127 disposed at both sides of the channel region 126, the source and drain regions 128 and 127 being doped with impurities. The arrows of FIG. 5 indicate the doping of impurities.

The first gate electrode 121 may be formed with a same impurity-doped polycrystalline silicon layer as the source and drain regions 128 and 127 of the second semiconductor layer 125. Thus, the organic light emitting diode display 101 may be simplified in overall structure by using a conductive impurity-doped polycrystalline silicon layer as the first gate electrode 121 and the source/drain regions of the second semiconductor layer 125. The process of manufacturing the organic light emitting diode display may be simplified by forming the first gate electrode 121 together with the second semiconductor layer 125, rather than separately forming them.

Figure 6:
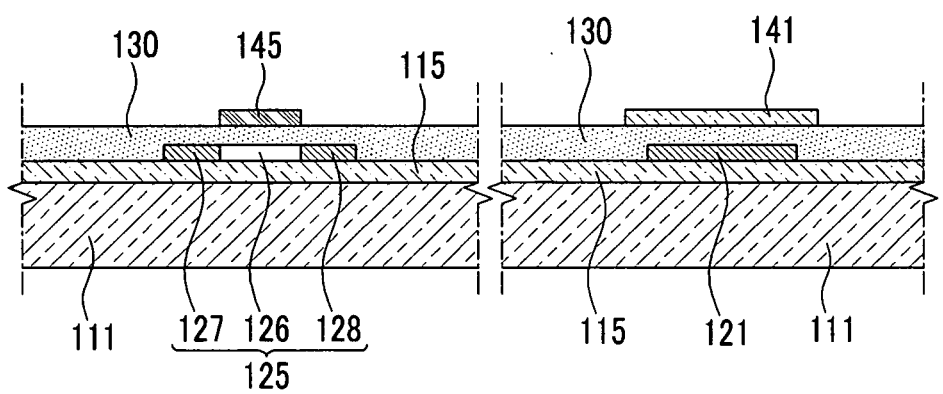

Referring to FIG. 6, the first semiconductor layer 141 may be formed on the gate insulating layer 130 such that ins partially overlapped with the first gate electrode 121. The first semiconductor layer 141 may be formed with an oxide semiconductor layer. The first semiconductor layer 141 may be formed by, e.g., depositing an oxide semiconductor using various suitable techniques such as physical vapor deposition (PVD), e.g., sputtering and evaporation, and then patterning the deposited material.

Next, referring again to FIG. 3, the interlayer insulating layer 150 may be formed on each of the first semiconductor layer 141 and the second gate electrode 145. The interlayer insulating layer 150 may be etched to thereby form the first source contact hole 153 and the first drain contact hole 154 partially exposing the first semiconductor layer 141, and the interlayer insulating layer 150 and the gate insulating layer 130 may be etched together to thereby form the second source contact hole 155 and the second drain contact hole 156 partially exposing the source and drain regions 128 and 127 of the second semiconductor layer 125.

Then, the first source electrode 163 and the first drain electrode 164 may be formed such that they respectively contact the first semiconductor layer 141 through the first source contact hole 153 and the first drain contact hole 154 while being spaced apart from each other by a distance, and the second source electrode 165 and the second drain electrode 166 may be formed such that they respectively contact the source and drain regions 128 and 127 of the second semiconductor layer 125 through the second source contact hole 155 and the second drain contact hole 156 while being spaced apart from each other by a distance.

An organic light emitting diode display 101 according to an exemplary embodiment may be simply manufactured through the above-described process. Generally, the use of a polycrystalline silicon thin film transistor and an oxide thin film transistor together may complicate the manufacturing process because the polycrystalline silicon thin film transistor and the oxide thin film transistor are differentiated in structure and material from each other. However, according to the embodiments described herein, the first thin film transistor 10 may be an oxide thin film transistor and the second thin film transistor 20 may be a polycrystalline silicon thin film transistor, and both may be formed together in an efficient and effective manner. For example, as described above, the first gate electrode 121 of the first thin film transistor 10 and the second semiconductor layer 125 of the second thin film transistor 20 may be formed on the same plane such that the process of manufacturing the organic light emitting diode display 101 is simplified.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A display, comprising:
a substrate main body;
a pixel on the substrate main body, the pixel including an organic light emitting diode, a first thin film transistor, and a second thin film transistor, wherein:
the first thin film transistor is electrically connected to the organic light emitting diode, the first thin film transistor including:
a first gate electrode, the first gate electrode including polycrystalline silicon,
a first semiconductor layer on the first gate electrode,
a first source electrode, and
a first drain electrode; and
the second thin film transistor is electrically connected to the first thin film transistor, the second thin film transistor including:
a second semiconductor layer, the second semiconductor layer including polycrystalline silicon and being on a same plane as the first gate electrode,
a second gate electrode on the second semiconductor layer,
a second source electrode, and
a second drain electrode.

2. The display as claimed in claim 1, wherein:
the first semiconductor layer is on the first gate electrode, and an insulating layer is disposed between the first semiconductor layer and the first gate electrode, and
the second gate electrode is on the second semiconductor layer, and the insulating layer extends between the second gate electrode and the second semiconductor layer.

3. The display as claimed in claim 1, wherein the first and second thin film transistors are different types of thin film transistors that are each included in the same pixel.

4. A display, comprising:
a substrate main body;
a pixel on the substrate main body, the pixel including an organic light emitting diode, a first thin film transistor, and a second thin film transistor, the first thin film transistor being electrically connected to the organic light emitting diode, and the second thin film transistor being electrically connected to the first thin film transistor,
wherein the pixel includes:
a first gate electrode of the first thin film transistor on the substrate main body, the first gate electrode including polycrystalline silicon;
a second semiconductor layer of the second thin film transistor on the substrate main body, the second semiconductor layer including polycrystalline silicon and being on a same plane as the first gate electrode;
a gate insulating layer, the gate insulating layer being on each of the first gate electrode and the second semiconductor layer;
a first semiconductor layer of the first thin film transistor on the first gate electrode, the gate insulating layer being between the first semiconductor layer and the first gate electrode;
a second gate electrode of the second thin film transistor on the second semiconductor layer, the gate insulating layer being between the second gate electrode and the second semiconductor layer; and
respective source and drain electrodes contacting the first and second semiconductor layers.

5. The display as claimed in claim 4, wherein the first gate electrode of the first thin film transistor and the second semiconductor layer of the second thin film transistor are each included in the same pixel.

6. The display as claimed in claim 4, further comprising an interlayer insulating layer, the interlayer insulating layer being on each of the first semiconductor layer and the second gate electrode, wherein:
- a first source electrode and a first drain electrode contact the first semiconductor layer and penetrate through the interlayer insulating layer, and
- a second source electrode and a second drain electrode contact the second semiconductor layer and penetrate through each of the interlayer insulating layer and the gate insulating layer.

7. The display as claimed in claim 4, wherein the first semiconductor layer includes an oxide semiconductor.

8. The display as claimed in claim 7, wherein the oxide semiconductor contains oxygen (O) and at least one element selected from the group consisting of gallium (Ga), indium (In), zinc (Zn), and tin (Sn).

9. The display as claimed in claim 7, wherein:
- the second semiconductor layer includes a channel region, a source region, and a drain region,
- the second gate electrode at least partially overlaps the channel region,
- the source and drain regions are disposed at respective sides of the channel region, and
- the source region, the drain region, and the first gate electrode are doped with impurities that are excluded from the channel region.

10. The display as claimed in claim 9, wherein:
- the channel region of the second semiconductor layer includes non-doped polycrystalline silicon, and
- the source and drain regions of the second semiconductor layer each include impurity-doped polycrystalline silicon.

11. The display as claimed in claim 10, wherein the impurities are P-type impurities.

12. The display as claimed in claim 10, wherein:
- the first gate electrode includes the same impurity-doped polycrystalline silicon as the source and drain regions of the second semiconductor layer, and
- the first gate electrode is disposed at a same plane as the source and drain regions of the second semiconductor layer.

13. A method of manufacturing an organic light emitting diode display, the method comprising:
- forming a pixel including an organic light emitting diode, forming the pixel includes:
- forming a first gate electrode of a first thin film transistor on a substrate main body, the first gate electrode including polycrystalline silicon;
- forming a second semiconductor layer of a second thin film transistor on the substrate main body, the second semiconductor layer including polycrystalline silicon and being formed on a same plane as the first gate electrode;
- forming a gate insulating layer, the gate insulating layer being formed on each of the first gate electrode and the second semiconductor layer;
- forming a first semiconductor layer of the first thin film transistor on the first gate electrode, the gate insulating layer being between the first semiconductor layer and the first gate electrode;
- forming a second gate electrode of the second thin film transistor on the second semiconductor layer, the gate insulating layer being between the second gate electrode and the second semiconductor layer; and
- forming respective source and drain electrodes contacting the first and second semiconductor layers,
- wherein the first thin film transistor is formed electrically connected to the organic light emitting diode, and the second thin film transistor is formed electrically connected to the first thin film transistor.

14. The method as claimed in claim 13, further comprising:
- patterning a polycrystalline silicon layer to form a first gate electrode precursor and a second semiconductor layer precursor from the polycrystalline silicon layer; and
- doping impurities into the first gate electrode precursor and the second semiconductor layer precursor to form the first gate electrode and the second semiconductor layer, respectively, wherein:
- the first semiconductor layer is formed on the gate insulating layer such that the first semiconductor layer is at least partially overlapped with the first gate electrode, and
- the second gate electrode is formed on the gate insulating layer such that the second gate electrode is at least partially overlapped with the second semiconductor layer.

15. The method as claimed in claim 14, wherein the first semiconductor layer is formed with an oxide semiconductor.

16. The method as claimed in claim 15, wherein the oxide semiconductor contains oxygen (O) and at least one element selected from the group consisting of gallium (Ga), indium (In), zinc (Zn), and tin (Sn).

17. The method as claimed in claim 14, wherein:
- the second semiconductor layer includes a channel region, a source region, and a drain region,
- the second gate electrode blocks the doping of the impurities in the channel region, and
- the source and drain regions are formed at respective sides of the channel region, the source and drain regions each being doped with the impurities.

18. The method as claimed in claim 17, wherein the impurities are P-type impurities.

19. The method as claimed in claim 17, wherein the first gate electrode is formed of a same doped material, and at a same plane, as the source and drain regions of the second semiconductor layer.

20. The method as claimed in claim 13, wherein:
- the second semiconductor layer includes a channel region, a source region, and a drain region, and
- the first gate electrode, the source region, and the drain region are doped with impurities that are excluded from the channel region, the first gate electrode is at a same plane as the source and drain regions of the second semiconductor layer.

* * * * *